(12) United States Patent
Jones et al.

(10) Patent No.: US 9,225,344 B2
(45) Date of Patent: Dec. 29, 2015

(54) METHODS AND APPARATUS FOR ALIGNING CLOCK SIGNALS ON AN INTEGRATED CIRCUIT

(71) Applicant: Altera Corporation, San Jose, CA (US)

(72) Inventors: Jakob Raymond Jones, San Jose, CA (US); David W. Mendel, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 219 days.

(21) Appl. No.: 13/742,775

(22) Filed: Jan. 16, 2013

(65) Prior Publication Data

US 2014/0198810 A1   Jul. 17, 2014

(51) Int. Cl.
*H03L 7/081* (2006.01)
*G06F 1/10* (2006.01)

(52) U.S. Cl.
CPC ............... *H03L 7/0814* (2013.01); *G06F 1/10* (2013.01)

(58) Field of Classification Search
USPC ......... 375/219, 376, 371, 375, 373, 354, 359, 375/358; 455/260, 256, 258, 192.1, 192.2, 455/192.3, 255; 370/463, 503, 419, 241, 370/507, 516, 286, 324, 350; 713/400, 600, 713/500, 503
See application file for complete search history.

(56) References Cited

U.S. PATENT DOCUMENTS

| | | | |
|---|---|---|---|
| 5,864,592 A * | 1/1999 | Itri ............................. | 375/375 |
| 6,194,969 B1 | 2/2001 | Doblar | |
| 6,208,621 B1 * | 3/2001 | Ducaroir et al. ............ | 370/241 |
| 6,516,422 B1 | 2/2003 | Doblar et al. | |
| 7,324,403 B2 * | 1/2008 | To et al. ...................... | 365/233.1 |
| 7,451,337 B1 * | 11/2008 | Hewitt ......................... | 713/400 |
| 7,593,498 B2 | 9/2009 | Dai et al. | |
| 8,107,442 B2 * | 1/2012 | Behzad et al. ............... | 370/335 |
| 8,132,039 B1 * | 3/2012 | Nguyen ....................... | 713/501 |
| 8,650,429 B1 * | 2/2014 | Starr et al. ................... | 713/400 |
| 2007/0264026 A1 * | 11/2007 | Miguel ........................ | 398/155 |
| 2007/0291828 A1 * | 12/2007 | Martin et al. ................ | 375/219 |
| 2008/0226004 A1 * | 9/2008 | Oh .............................. | 375/358 |

FOREIGN PATENT DOCUMENTS

| | | |
|---|---|---|
| EP | 0766892 | 9/1997 |
| EP | 0851324 | 6/2012 |
| WO | 2008109981 | 9/2008 |

* cited by examiner

*Primary Examiner* — Benjamin H Elliott, IV
*Assistant Examiner* — Eric Nowlin

(57) ABSTRACT

A method of aligning clock signals in multiple transceiver channels on an integrated circuit may include adjusting a slave clock signal at a slave transceiver channel based on a master clock signal received from a master transceiver channel. A clock generation circuit and/or a delay circuit in the slave transceiver channel may be used to adjust the slave clock signal to produce an intermediate slave clock signal. The master clock signal may be adjusted based on the intermediate slave clock signal received at the master transceiver channel to obtain a total adjustment value. The phase of the intermediate slave clock signal may further be adjusted at the slave transceiver channel based on the total adjustment made at the master transceiver channel.

18 Claims, 11 Drawing Sheets

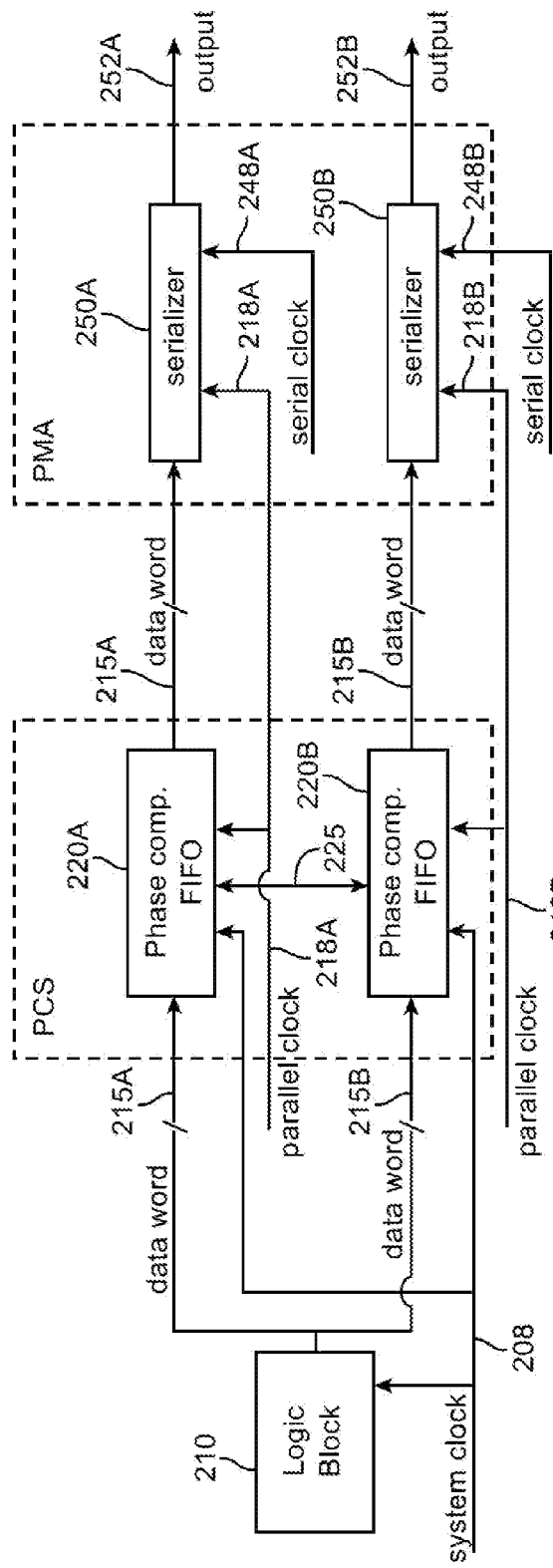
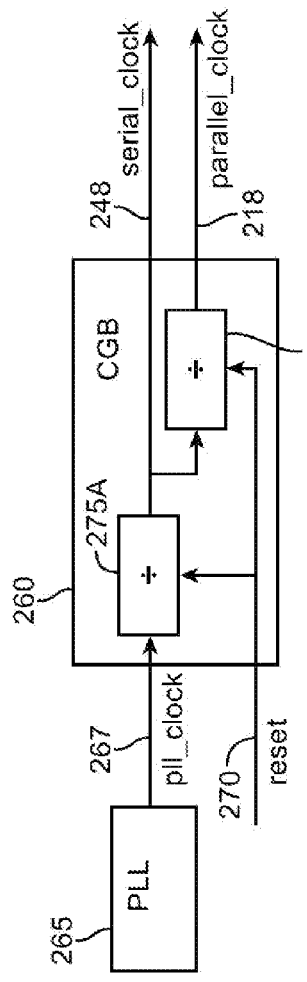
FIG. 2A
FIG. 2B

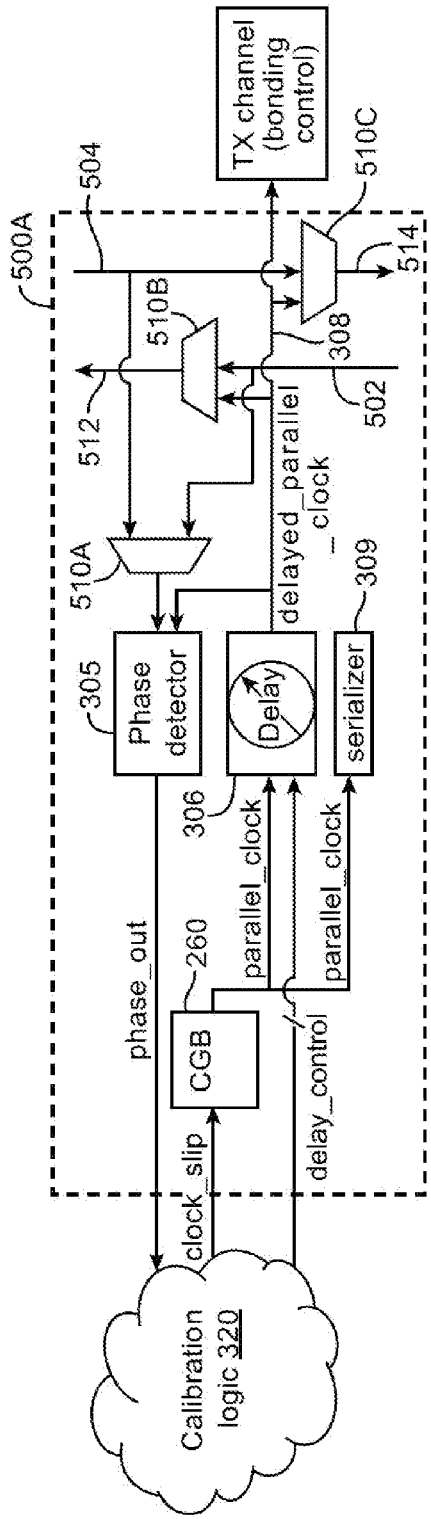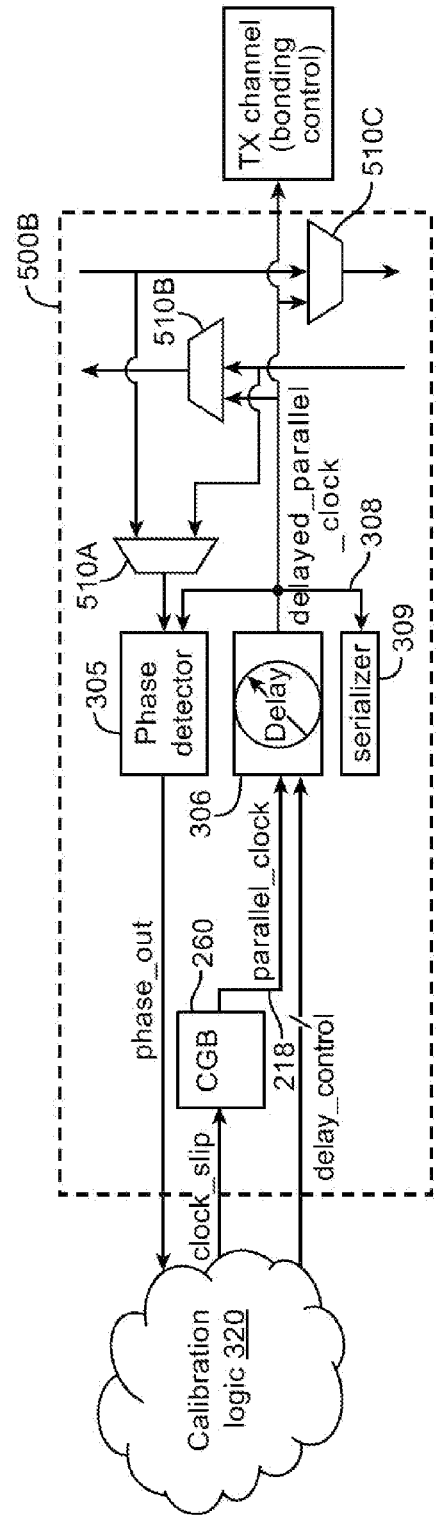
FIG. 5A
FIG. 5B

METHODS AND APPARATUS FOR ALIGNING CLOCK SIGNALS ON AN INTEGRATED CIRCUIT

BACKGROUND

Integrated circuit devices, such as field-programmable gate arrays (FPGAs), application specific integrated circuits (ASICs), and the like, may be used to implement a variety of functions. For instance, an FPGA device may be configured to perform various user functions based on different user designs. Integrated circuit devices may be employed in various different systems (e.g., communication systems).

An integrated circuit device may include multiple input-output elements that support a wide variety of protocols. As an example, an integrated circuit device may include high-speed transceiver (transmitter and receiver) channels that may be used to communicate with other components or circuits connected to the device. Transceiver channels on an integrated circuit device typically support multiple different input-output protocols.

Many multi-lane high-speed serial interface protocols (e.g., Interlaken, PCI Express, XAUI) may impose a requirement on the amount of data skew that can exist between any two transmit channels in a particular interface. To ensure proper synchronization between the different channels, circuitry may be used to minimize skew. Such circuitry may be used to "bond" transceiver channels (e.g., to reduce skew between each pair of transceiver channels).

Generally, conventional techniques for transceiver channel bonding impose several limitations and tradeoffs (e.g., limits on supported data rates, the number of channels that can be bonded, the placement of channels, etc.). To overcome some of these limitations and tradeoffs, integrated circuit devices typically include circuitry to support multiple different bonding methods. The need to include such types of bonding circuitry, however, results in additional silicon area overhead and may increase design complexity (i.e., longer verification time is needed).

SUMMARY

Circuitry and techniques for dynamically minimizing skew across multiple input-output elements (e.g., transceiver channels) in a high-speed serial interface are provided. Embodiments of the present invention include circuits and techniques to bond multiple transceiver channels together.

It is appreciated that the present invention can be implemented in numerous ways, such as a process, an apparatus, a system, or a device. Several inventive embodiments of the present invention are described below.

A method of aligning clock signals in multiple transceiver channels in an integrated circuit may include adjusting a phase of a slave clock signal based on a phase of a master clock signal to produce an intermediate slave clock signal. The master clock channel may be received from a master transceiver channel. The phase of the master clock signal may then be adjusted based on the phase of the intermediate slave clock signal produced by a slave transceiver channel. A total adjustment value is obtained based on the adjustment made and the phase of the intermediate slave clock signal may be further adjusted at the slave transceiver channel based on the total adjustment value obtained. An adjusted slave clock signal may be produced by the slave transceiver channel.

A method of calibrating clock signals in an integrated circuit may include receiving clock signals at different transceiver channel circuitries and adjusting the received clock signals. As an example, first transceiver channel circuitry with a first clock signal may receive a second clock signal from second transceiver channel circuitry. The first transceiver channel circuitry may include clock generation circuitry. The clock generation circuitry may adjust the phase of the first clock signal based on the phase of the second clock signal received at the first transceiver channel circuitry. In one embodiment, the first transceiver channel circuitry may further include delay circuitry. The phase of the first clock signal may be adjusted with the delay circuitry based on a predetermined offset value to align the phase of the second clock signal at the second transceiver channel circuitry.

An integrated circuit may include transceiver channel circuitry with clock circuitry operable to output a channel clock signal. The integrated circuit may further include a phase detector circuit that is operable to compare the channel clock signal with a reference clock signal to produce a phase output signal in response to the comparison between the channel clock signal and the reference clock signal. The integrated circuit may also include delay circuitry operable to receive the channel clock signal and the phase output signal to produce a delayed channel clock signal based on the channel clock signal and the control signal.

BRIEF DESCRIPTION OF THE DRAWINGS

FIG. 2A shows two illustrative serializers coupled in a bonded configuration in accordance with one embodiment of the present invention.

FIG. 2B shows illustrative clock generation buffer circuitry in accordance with one embodiment of the present invention.

FIG. 5A shows an illustrative transceiver channel circuit with calibration circuitry in accordance with one embodiment of the present invention.

FIG. 5B shows an illustrative transceiver channel in accordance with another embodiment of the present invention.

DETAILED DESCRIPTION

The embodiments provided herein include circuitry and techniques to synchronize clock signals (e.g., clock signals between different input-output channels) in an integrated circuit (IC).

It will be obvious to one skilled in the art that the present exemplary embodiments may be practiced without some or all of these specific details. In other instances, well-known operations have not been described in detail in order not to unnecessarily obscure the present embodiments.

Figure 1:
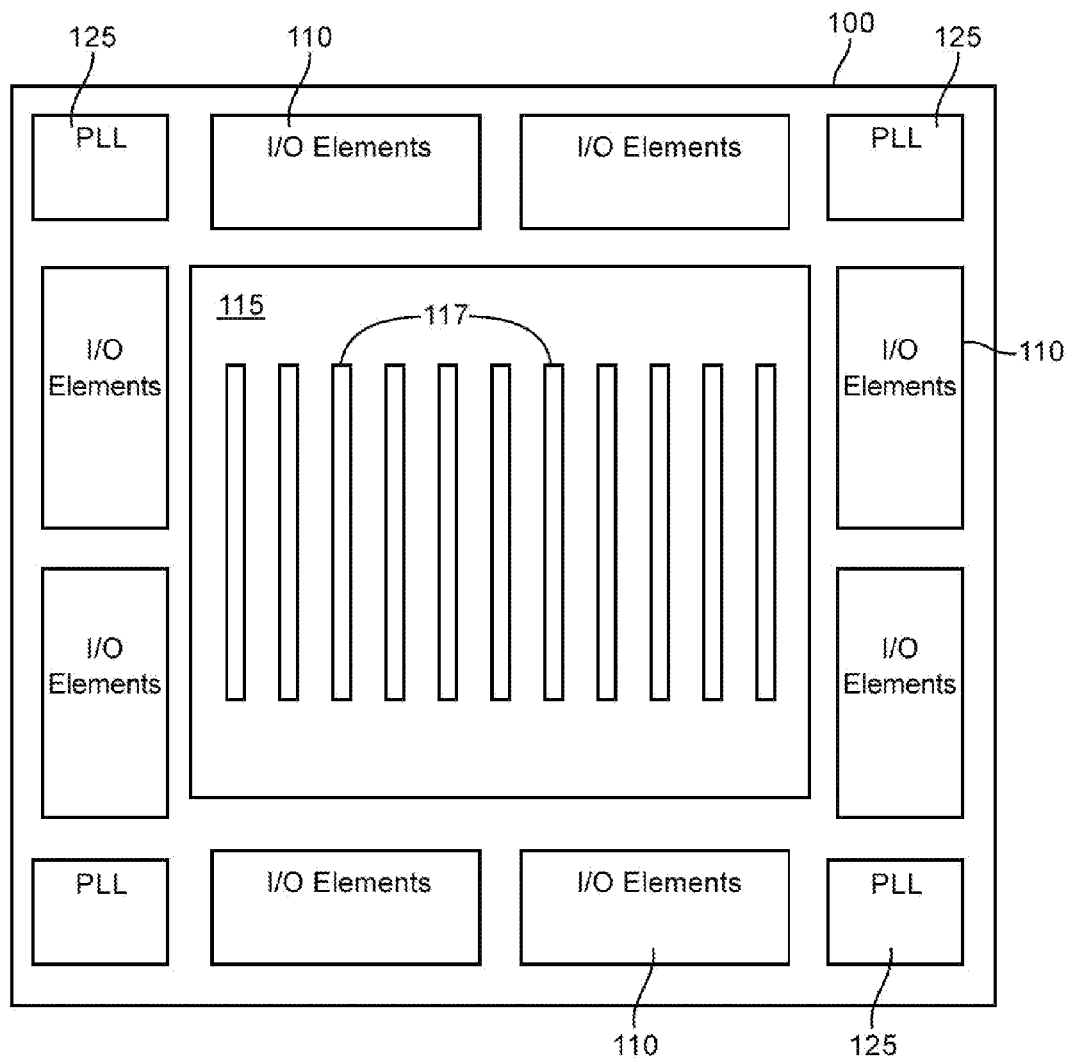
FIG. 1 is a block diagram of an illustrative integrated circuit in accordance with one embodiment of the present invention.

An IC device such as a field-programmable gate array (FPGA) device, generally includes high-speed input-output circuitry, including, among others, transceiver channels. FIG. 1, meant to be illustrative and not limiting, shows a simplified block diagram of IC 100 that can implement embodiments of the present invention. Generally, an IC device such as IC 100 includes core logic region 115 and input-output elements 110. Other auxiliary circuits, such as phase-locked loops (PLLs) 125 for clock generation and timing, can be located outside the core logic region 115 (e.g., at corners of IC 100 and adjacent to input-output elements 110) or elsewhere on IC 100.

Core logic region 115 may be populated with logic cells that include "logic elements" (LEs) 117, among other circuits. LEs 117 may include look-up table-based logic regions and may be grouped into "Logic Array Blocks" (LABs). LEs 117 and groups of LEs or LABs can be configured to perform logical functions desired by the user. Configuration data loaded into configuration memory can be used to produce control signals that configure LEs 117 and groups of LEs and LABs to perform the desired logical functions. Signals received from external circuitry at input-output elements 110 may be routed from input-output elements 110 to core logic region 115 and other logic blocks on IC 100. Core logic region 115 and other logic blocks on IC 100 may perform functions based on the signals received.

Signals may be sent from core logic region 115 and other relevant logic blocks of IC 100 to other external circuitry or components that may be connected to IC 100 through input-output elements 110. A single device like IC 100 can potentially support a variety of different interfaces and each individual input-output bank 110 can support a different input-output standard with a different interface or protocol (e.g., a high-speed serial interface protocol).

In the embodiment of FIG. 1, input-output elements 110 may include input-output buffers and high-speed transmitter/receiver circuitry that connect IC 100 to other external components. A transceiver channel may generally be divided into two blocks (not shown in FIG. 1). A transceiver channel may, for example, include a physical coding sublayer (PCS) block and a physical medium attachment (PMA) block. The PCS block is a block that is located between the core region of the device (e.g., core region 115) and the PMA block. The PCS may include, among others, decoders, encoders, alignment circuitry, and registers such as first-in-first-out (FIFO) blocks. The PMA block generally connects the IC device (e.g., IC 100) to the channel, generates the required clocks, and converts data from parallel to serial (and from serial to parallel).

Accordingly, in a transceiver channel, a serializer may be included in the PMA transmitter block. The serializer may take in a parallel data word and serialize the data for transmission at a higher serial data rate. As an example, a parallel data word may be latched into the serializer by a parallel clock and shifted out of the serializer by a serial clock (e.g., a clock signal that typically exhibits a higher frequency compared to the parallel clock).

Multiple transceiver channels, or more specifically, serializers in the different transceiver channels may be coupled together in a bonded configuration. FIG. 2A shows two serializers, 250A and 250B, paired together in a bonded configuration in accordance with one embodiment of the present invention. It should be appreciated that even though only two serializers are shown, more serializers may be bonded together in this context. In the embodiment of FIG. 2A, serializers 250A and 250B receive data words 215A and 215B, respectively, from logic block 210 via phase compensation FIFOs 220A and 220B, respectively. Logic block 210 may be a protocol interface logic block that is implemented in the core region of an integrated circuit (e.g., core region 115 of FIG. 1). Phase compensation FIFOs 220A and 220B may be part of the PCS block that lies between the core region of the integrated circuit and the PMA block.

In the embodiment of FIG. 2A, serializers 250A and 250B may be part of the PMA block. As mentioned above, serializers 250A and 250B may convert lower speed parallel signals to a high speed serial signal. In the embodiment of FIG. 2A, phase compensation FIFOs 220A and 220B receive system clock signal 208 and the respective parallel clock signals, 218A and 218B. It should be appreciated that each transceiver channel may include a dedicated phase compensation FIFO (e.g., phase compensation FIFOs 220A and 220B) that decouples phase variations that may exist between the system clock domain and the transceiver channel clock domain.

Data words 215A and 215B are transferred from the system clock domain to the respective parallel clock domain for each transceiver. The data words 215A and 215B are then transmitted from the parallel clock domain of each transceiver to the respective serializers 250A and 250B for serial transmission. Dedicated circuitry (represented by bonding circuitry bus 225 in FIG. 2A) may be used to ensure that the read side of the phase compensation FIFOs (e.g., 220A and 220B) for every transceiver channel is released simultaneously so that data words 215A and 215B are removed from phase compensation FIFOs 220A and 220B simultaneously (or at least relatively simultaneously, with the least possible amount of skew).

In one embodiment, the bonding control circuitry (shown as bonding circuitry bus 225 coupled between phase compensation FIFOs 220A and 220B) may require handshaking signals to be passed between the bonded transceiver channels to ensure that phase compensation FIFOs 220A and 220B are fully synchronized (e.g., when transitions of logic levels in FIFOs 220A and 220B occur essentially simultaneously or the transitions are closely related to changes in logic levels of a common clock signal). Without this circuitry, phase compensation FIFOs 220A and 220B may potentially end up in different states and there may be data skew when data words 215A and 215B are transmitted to the respective serializers 250A and 250B.

It should be appreciated that serializers 250A and 250B in the PMA block serializes the parallel data words 215A and 215B received from the PCS block and transmit the parallel data words as outputs 252A and 252B, respectively. In the embodiment of FIG. 2A, serializers 250A and 250B are clocked by respective parallel clock signals 218A and 218B and respective serial clock signals 248A and 248B. It should be appreciated that each transceiver channel may include its own clock generation circuitry (not shown in FIG. 2A) to generate its own serial and parallel clock signals.

Accordingly, the parallel clock signals (e.g., 218A and 218B) and serial clock signals (248A and 248B) may be generated by their respective clock generation buffer circuits (the details of which will be explained in reference to FIG. 2B below). Skew (or more specifically, serial clock skew) may arise between serializers 250A and 250B as clock signals 218A and 218B may arrive at a different time at the respective serializers. There may also be parallel clock skew between parallel clock signals 218A and 218B and parallel data skew between parallel data words 215A and 215B. However, the serial clock skew between serializers 250A and 250B may be relatively less significant compared to the parallel clock skew and parallel data skew between phase compensation FIFOs 220A and 220B.

FIG. 2B shows illustrative clock generation buffer circuitry 260 in accordance with one embodiment of the present invention. Clock generation buffer circuitry 260 may receive a high frequency clock from a clock source, such as pll_clock 267 from PLL circuitry 265, and a reset signal, (e.g., reset 270). Clock generation buffer circuitry 260 may also include multiple divider circuits such as divider circuits 275A and 275B.

Divider circuit 275A divides the input clock signal (in this case, pll_clock 267) to produce a high-frequency serial clock signal (e.g., serial_clock 248), and divider circuit 275B further divides the input clock signal to produce a low-frequency parallel clock (e.g., parallel_clock 218). It should be appreciated that each transceiver channel may have its own clock generation buffer circuitry such as clock generation buffer circuitry 260 to allow each channel to run separately in non-bonded configurations. However, in bonded configurations, clock skew may occur between clocks across multiple channels when each channel produces its own divided clocks. Thus, calibration may be needed to minimize skew between multiple bonded transceiver channels (e.g., calibration to reduce data skew between phase compensation FIFOs 220A and 220B of FIG. 2A).

Figure 3A:
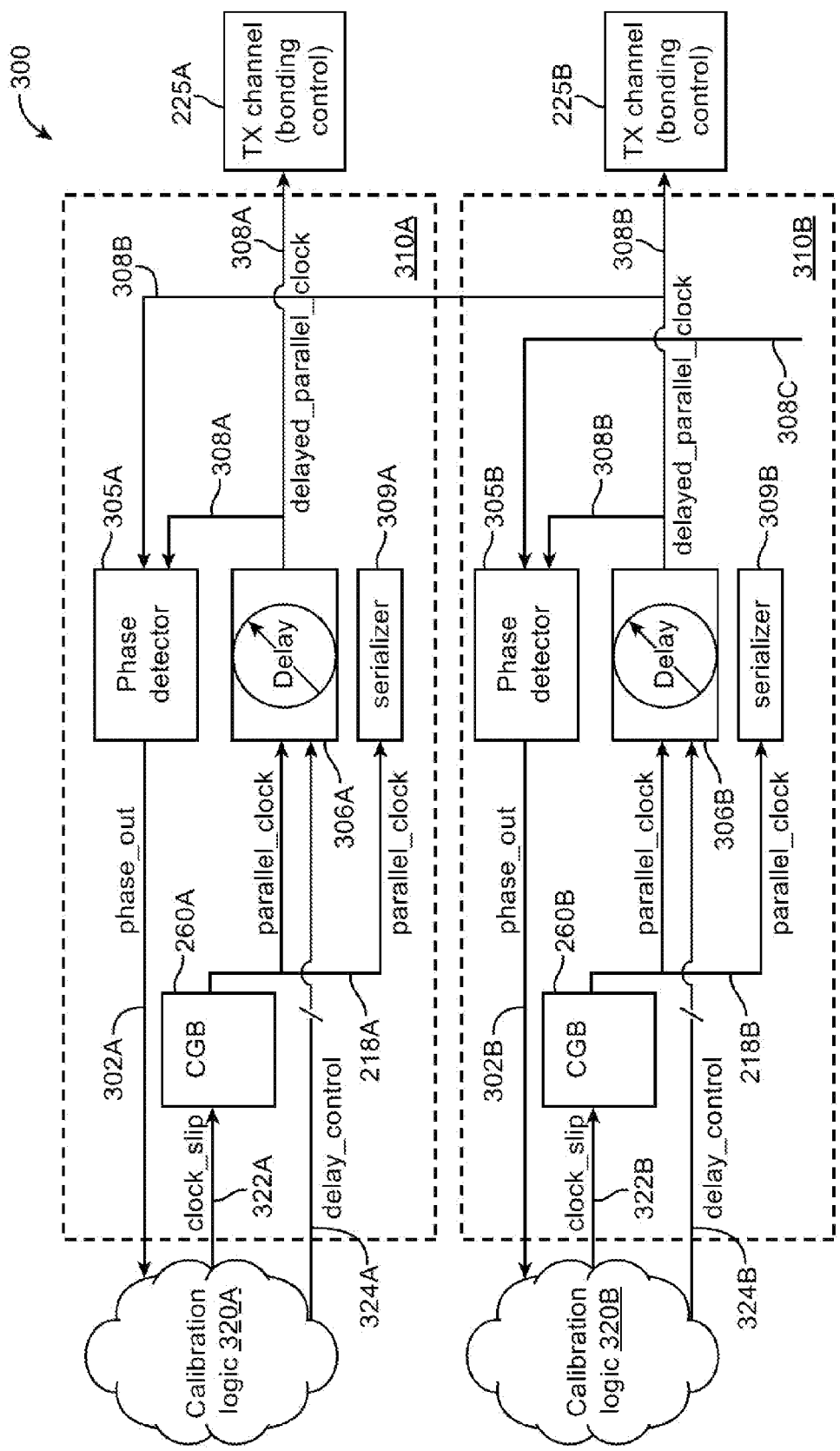
FIG. 3A shows illustrative bonded transceiver channel circuitry with calibration circuitry in accordance with one embodiment of the present invention.

FIG. 3A shows illustrative bonded transceiver channel circuitry 300 with calibration circuitry in accordance with one embodiment of the present invention. Transceiver channels 310A and 310B are coupled together in a bonded configuration in the embodiment of FIG. 3A. A transceiver channel may include, among others, clock generation buffer circuitry, a phase detector circuit, and delay circuitry. As an example, transceiver channel 310A includes its own clock generation buffer circuitry 260A, phase detector circuit 305A, and delay circuitry 306A. Clock generation buffer circuitry 260A may generate a parallel clock signal (e.g., parallel_clock 218A) for transceiver channel 310A (and serializer 309A) and clock generation buffer circuitry 260B may generate another parallel clock signal (e.g., parallel_clock 218B) for transceiver channel 310B (and serializer 309B).

In bonded transceiver channel circuitry 300, transceiver channel 310A may be a slave transceiver channel and transceiver channel 310B may be a master transceiver channel. As such, the parallel clock signal at transceiver channel 318B (e.g., delayed_parallel_clock 308B) may be a master clock signal that is transmitted from the master transceiver channel (e.g., transceiver channel 310B) to the slave transceiver channel (e.g., transceiver channel 310A) to calibrate the slave clock signal at the slave transceiver channel.

As an example, clock generation buffer circuitry 260B may generate a parallel clock signal, parallel_clock signal 218B. Delay circuitry 306B may receive parallel_clock signal 218B and is operable to delay parallel_clock signal 218B as needed. For instance, prior to calibration, parallel_clock signal 218B may be transmitted from delay circuitry 306B as delayed_parallel_clock signal 308B without any actual delay applied to the clock signal (e.g., parallel_clock signal 218B). In the embodiment of FIG. 3A, delayed_parallel_clock signal 308B may be transmitted from master transceiver channel 310B to phase detector circuit 305A of slave transceiver channel 310A. Phase detector circuit 305A compares delayed_parallel_clock signal 308B with delayed_parallel_clock signal 308A to determine the level of adjustment that may be needed for delayed_parallel_clock signal 308A. Phase detector circuit 305A may then generate a control signal (e.g., phase_out signal 302A) to adjust the phase of the slave clock signal (in this case, delayed_parallel_clock signal 308A) based on delayed_parallel_clock signal 308B that is received at slave transceiver channel 310A.

In the embodiment of FIG. 3A, phase detector circuit 305A generates and transmits phase_out signal 302A to calibration logic 320A. Calibration logic 320A may generate another control signal, clock_slip signal 322A, to adjust the slave clock signal (e.g., to adjust parallel_clock signal 218A). In one embodiment, clock_slip signal 322A may delay the slave clock signal, which is generated by clock generation buffer circuitry 260A, by at least one clock cycle to adjust the phase of the slave clock signal (e.g., parallel_clock signal 218A).

In one embodiment, the adjustment made (e.g., an adjustment based on phase_out signal 302A from phase detector circuit 305A) to the slave clock signal at slave transceiver channel 310A at this stage may be known as a coarse-grain adjustment. The adjusted slave clock signal from clock generation buffer circuitry 260A (e.g., parallel_clock signal 218A) may be further adjusted by delay circuitry 306A. In one embodiment, calibration logic 320A may output another control signal (e.g., delay_control signal 324A) and delay circuitry 306A may adjust parallel_clock signal 218A, based on the control signal received from calibration logic 320A. The adjustment made by delay circuitry 306A may be known as a fine-grain adjustment, and the resulting signal may be referred to as a fine-tuned clock signal. Compared to a coarse-grain adjustment, a fine-grain adjustment is a more precise adjustment. For instance, the fine-grain adjustment may allow delay adjustments to be made in relatively smaller increments compared to the coarse-grain adjustment.

Delay circuitry 306A may then generate an intermediate slave clock signal such as delayed_parallel_clock signal 308A. In one embodiment, the intermediate slave clock signal may then be adjusted based on a predetermined offset value. As an example, the predetermined offset value may be obtained during characterization of the device. The slave clock signal at slave transceiver channel 310A may thus be aligned with the master clock signal at master transceiver channel 310B after the intermediate slave clock signal has been shifted by the predetermined offset value.

The aligned slave clock signal (in this case, delayed_parallel_clock signal 308A) may be transmitted from delay circuitry 306A as an output at slave transceiver channel 310A. In one embodiment, the aligned slave clock signal may be transmitted through bonding control circuitry 225A to a phase compensation FIFO in another transceiver channel to ensure that the phase compensation FIFOs (e.g., phase compensation FIFOs 220A and 220B of FIG. 2A) are properly synchronized. It should be appreciated that in order to reduce skew between bonded channels, parallel data from the phase compensation FIFOs (not shown in the embodiment of FIG. 3A) at the respective transceiver channels (e.g., transceiver channels 310A and 310B) may need to arrive at the respective serializers (e.g., serializers 309A and 309A) at approximately the same time.

As shown in FIG. 3A, serializer 309A receives parallel_clock signal 218A from clock generation buffer circuitry 260A. As such, serializer 309A may receive the adjusted slave clock signal (e.g., parallel_clock signal 218A) from clock generation buffer circuitry 260A, and not the fine-tuned clock signal (e.g., delayed_parallel_clock signal 308A) from delay circuitry 306A. However, it should be appreciated that serializer 309A (or 309B) may receive either the fine-tuned clock signal (e.g., delayed_parallel_clock signal 218A or 218B) from delay circuitry 306A (or 306B) or the adjusted slave clock signal from clock generation buffer circuitry 260A (or 260B) in this context.

It should be appreciated that circuit elements (e.g., clock generation buffer circuitry 206B, phase detector circuit 305B, delay circuitry 206B, serializer 309B, bonding control circuitry 225B, calibration logic 320B, etc.) in transceiver channel 310B may operate similarly as their respective circuit elements in transceiver channel 310A, and as such, for the sake of brevity, the functionality of these circuit elements are not described in detail again. For instance, transceiver channel 310B may receive a calibration clock signal 308C from another transceiver channel (not shown in FIG. 3A) and phase detector circuit 305B may compare the phase difference between the clock signal generated by clock generation buffer circuitry 260B (e.g., parallel_clock signal 218B) and clock signal 308C, and output a control signal, phase_out 302B, to calibration logic 320B. Calibration logic 320B, in turn, may generate delay_control signal 324B and clock_slip signal 322B to tune the clock signal at transceiver channel 310B (namely, parallel_clock signal 218B which is generated by clock generation buffer circuitry 260B) according to clock signal 303C that is received from the other transceiver channel.

Figure 3B:
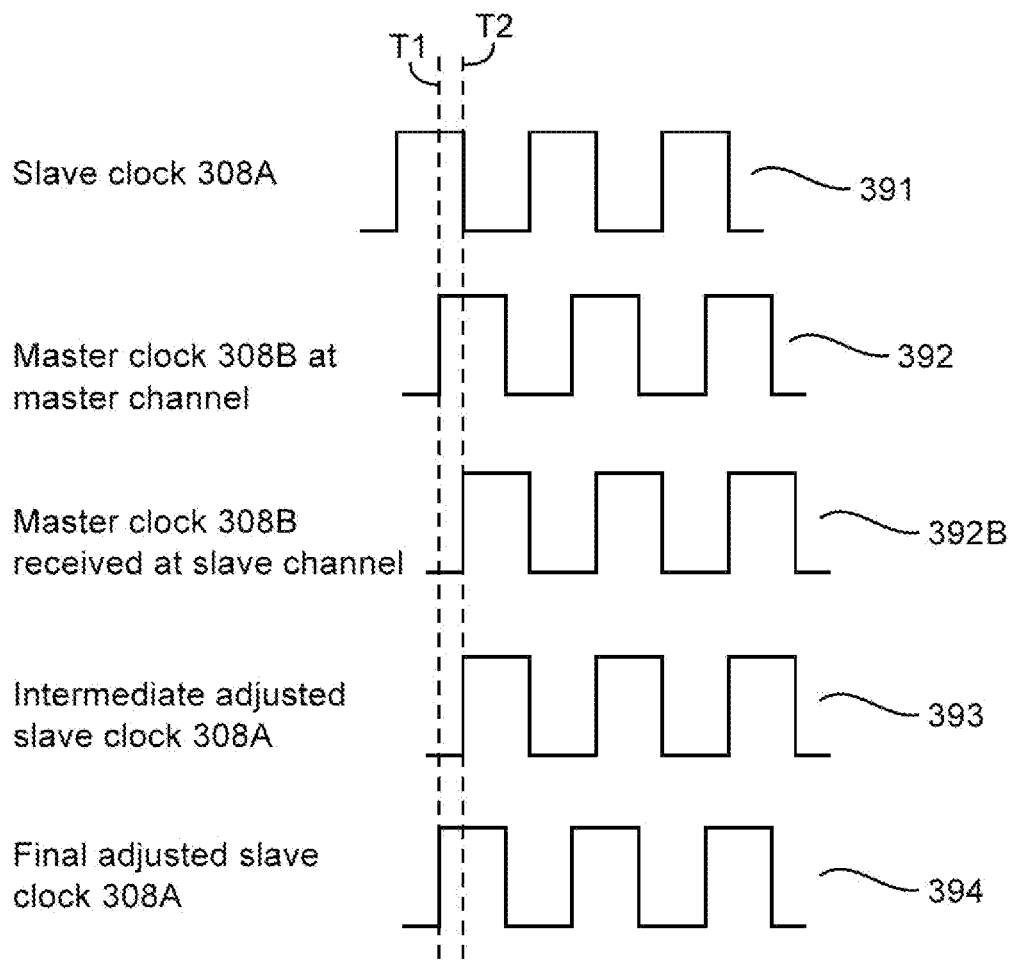
FIG. 3B shows illustrative waveforms that depict the different stages of slave and master clock signals in accordance with one embodiment of the present invention.

FIG. 3B shows illustrative waveforms that depict the different stages of slave and master clock signals in accordance with one embodiment of the present invention. Waveform 391 may represent the initial phase of slave clock signal 308A at transceiver channel 310A of FIG. 3A and waveform 392 may represent the initial phase of master clock signal 308B at transceiver channel 310B of FIG. 3A. As shown in the embodiment of FIG. 3B, the first rising edge of the master clock signal 308B may correspond to time T1.

Waveform 392B depicts the master clock signal 308B received at a slave transceiver channel. It should be appreciated that there may be some propagation delay when master clock signal 308B is transmitted to the slave transceiver channel (e.g., 310A of FIG. 3A), and as such, the first rising edge of the master clock signal 308B received at the slave transceiver channel may correspond to time T2 (e.g., at a time later than time T1). Accordingly, the slave clock signal at the slave transceiver channel (e.g., parallel_clock signal 218A at transceiver channel 310A of FIG. 3A) may be adjusted according to the phase of the received master clock signal 308B. In the embodiment of FIG. 3A, phase detector circuit 305A outputs phase_out signal 302A to calibration logic 320A and in turn to control clock_slip signal 322A in order to adjust the phase of the clock signal generated by clock generation buffer circuitry 260A.

Waveform 393 represents the intermediate adjusted slave clock signal that is adjusted according to the master clock signal 308B received at the slave transceiver channel. As shown by waveforms 392B and 393, the edges of the intermediate adjusted slave clock signal may align with the edges of the received master clock signal (e.g., the first rising edge of the intermediate adjusted clock signal correspond to the first rising edge of the received master clock signal at time T2).

The slave clock signal 308A may be further adjusted by a predetermined offset value so that the edges of the adjusted slave clock signal may be aligned with the edges of the master clock signal 308B at the master transceiver channel. As shown in the waveform 394 of FIG. 3B, the first rising edge of the final adjusted slave clock signal 308A (at the slave transceiver channel) is aligned with the first rising edge of the master clock signal 308B (at the master transceiver channel) at time T1.

Figure 4:
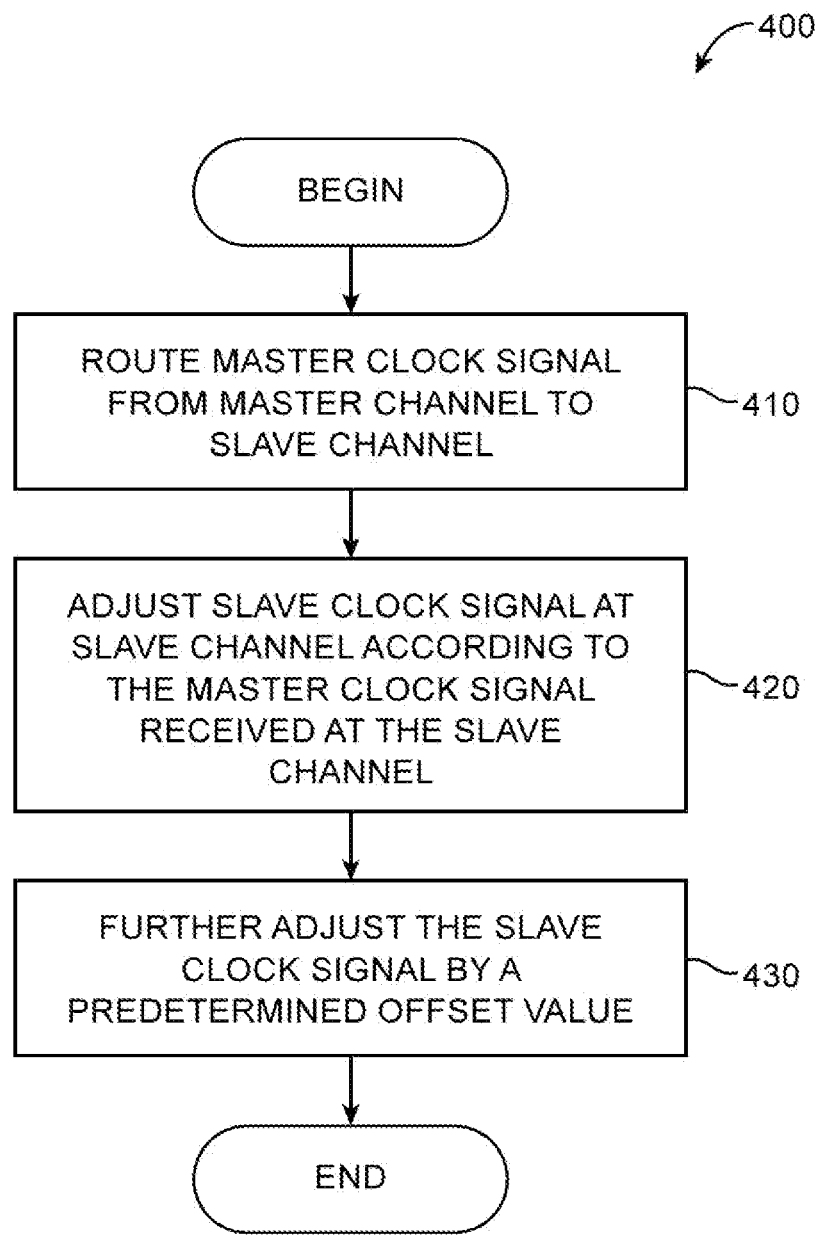
FIG. 4 shows illustrative steps for calibrating clock signals in an integrated circuit in accordance with one embodiment of the present invention.

FIG. 4 shows illustrative method 400 for calibrating clock signals in an integrated circuit in accordance with one embodiment of the present invention. At step 410, a master clock signal may be routed from a master channel to a slave channel. The slave clock signal at the slave channel may be adjusted according to the master clock signal received at the slave channel at step 420. In one embodiment, the adjusted slave clock signal may be represented by waveform 393 of FIG. 3B. At step 430, the slave clock signal may further be adjusted by a predetermined offset value. As an example, the predetermined offset value may be obtained during characterization of the integrated circuit and may be stored as an offset value in the integrated circuit. The final adjusted slave clock signal may be similar to the adjusted slave clock signal as represented by waveform 394 of FIG. 3B (where edges of the adjusted slave clock signal may be aligned with the edges of the master clock signal at the master channel).

FIG. 5A shows illustrative transceiver channel circuit 500A with calibration circuitry in accordance with one embodiment of the present invention. It should be appreciated that transceiver channel circuit 500A shares similarities with transceiver channels 310A and 310B of FIG. 3A. As such, for the sake of brevity, signals and elements that have been described above (e.g., clock generation buffer circuitry 260, calibration logic 320, phase detector circuit 305, serializer 309, delay circuitry 306, etc.) will not be described in detail again.

In the embodiment of FIG. 5A, transceiver channel circuit 500A includes multiple selector circuits, namely, selector circuits 510A-510C. Each of the selector circuits 510A-510C may be a two-input multiplexing circuit that may be configured to route different clock signals to or from transceiver channel circuit 500A (the details of which will be shown in FIGS. 6A and 7A). For instance, as shown in FIG. 5A, multiplexing circuit 510A may receive an input signal 504 from a top transceiver channel (not shown) and another input signal 502 from a bottom transceiver channel (not shown).

In one embodiment, input signals 504 and 502 may be clock signals from adjacent transceiver channels. As such, multiplexing circuit 510A may selectively couple a clock signal (either from a top transceiver channel or a bottom transceiver channel) to phase detector circuit 305. Accordingly, as explained above, phase detector circuit 305 may compare the phase of the selected clock signal (e.g., either input signal 504 or 502) with the clock signal (e.g., delayed_parallel_clock signal 308) at transceiver channel 500A.

In the embodiment of FIG. 5A, multiplexing circuit 510B may receive the clock signal (e.g., delayed_parallel_clock signal 308) at transceiver channel 500A and clock signal 502 from a different transceiver channel (e.g., a bottom adjacent transceiver channel). Multiplexing circuit 510B may then selectively transmit either one of the clock signals as an output 512 to another transceiver channel (e.g., a top adjacent transceiver channel). Similarly, multiplexing circuit 510C may receive the clock signal (e.g., delayed_parallel_clock signal 308) at transceiver channel 500A and another clock signal 504 from a different transceiver channel (e.g., a top adjacent transceiver channel), and selectively transmit either one of the clock signals as an output 514 to another transceiver channel (e.g., a bottom adjacent transceiver channel). It should be appreciated that multiple transceiver channels similar to transceiver channel 500A may be coupled together. Each transceiver channel may also include multiplexing circuits such as multiplexing circuits 510A-510C that may be used to route signals or clock signals from one transceiver channel to another.

FIG. 5B shows illustrative transceiver channel 500B in accordance with another embodiment of the present invention. It should be appreciated that transceiver channel 500B shares similarities with transceiver channel 500A of FIG. 5A and as such, for the sake of brevity, elements (e.g., multiplexing circuits 510A-510C, etc.) that have been described above are not repeated. In the embodiment of FIG. 5B, parallel_clock signal 218 generated by clock buffer circuitry 260 may not be transmitted directly to serializer 309. Instead, serializer 309 receives a delayed clock signal (e.g., delayed_parallel_clock signal 308) from delay circuitry 306). Transmitting the delayed clock signal to the serializer 309 may allow for fine-grain control of serializer 309. In one embodiment, serializer 309 may include a phase interpolator (not shown) to further adjust the phase of the delayed clock signal.

Figure 6A:
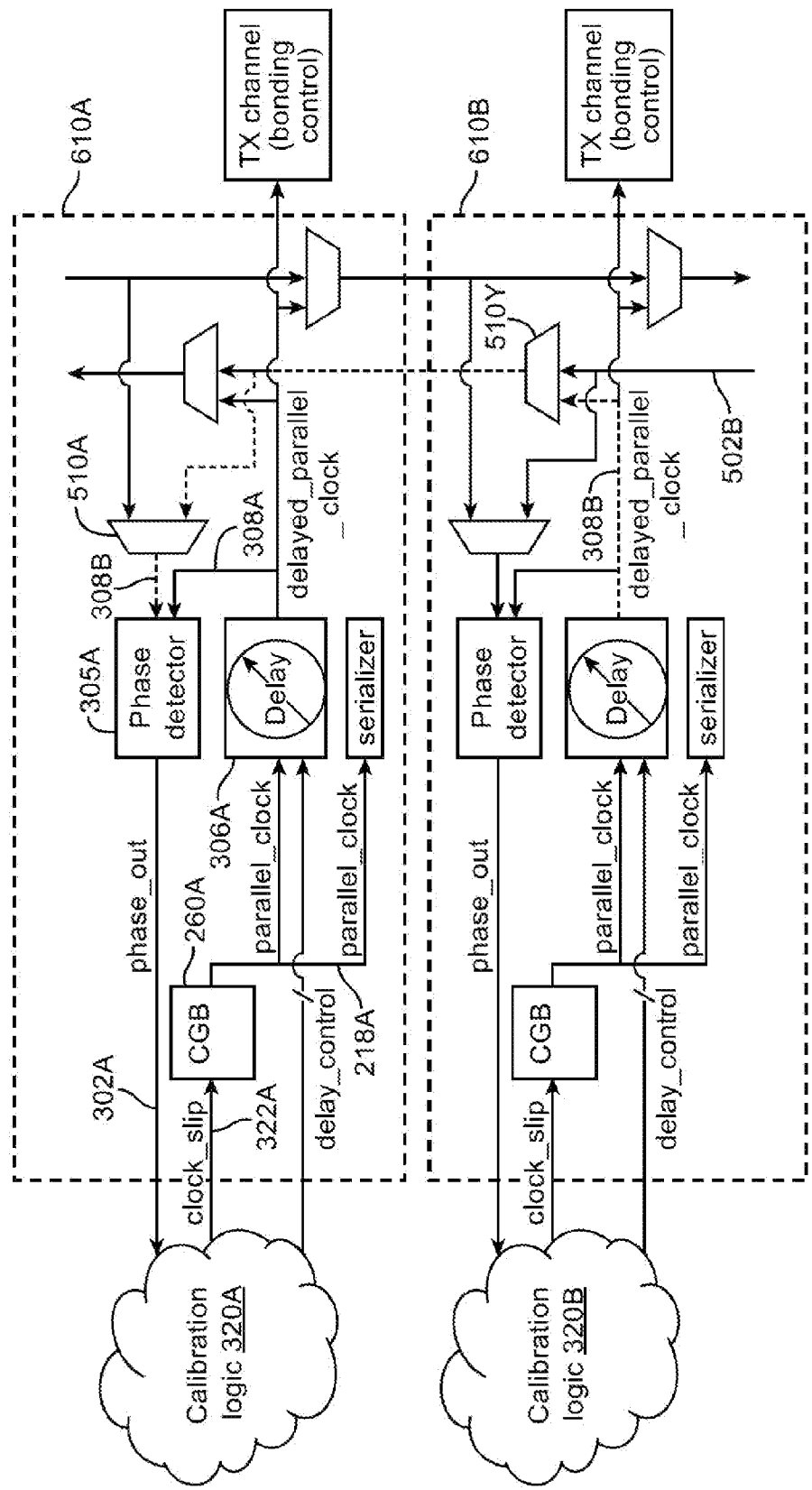
FIG. 6A depicts two illustrative transceiver channels together in a "bonding up" configuration in accordance with one embodiment of the present invention.

FIG. 6A depicts two transceiver channels (e.g., transceiver channel 610A and 610B) coupled together in accordance with one embodiment of the present invention. It should be appreciated that transceiver channels 610A and 610B may be similar to transceiver channel 500A of FIG. 5A. However, even though not shown in FIG. 6A, it should also be appreciated that transceiver channel 500B of FIG. 5B may also be used in this context (e.g., multiple transceiver channels 500B may be coupled together). In one embodiment, transceiver channel 610A may be a slave transceiver channel that receives a calibration clock signal from a master transceiver channel (e.g., transceiver channel 610B). This may be referred to as "bonding up" as transceiver channel 610B, as shown in FIG. 6A, may be a transceiver channel at the bottom of transceiver channel 610A. The dotted line in FIG. 6A shows the "bonding up" path of the clock signal transmitted from transceiver channel 610B to transceiver channel 610A.

Multiplexing circuits 510A may be configured to select and transmit a clock signal from transceiver channel 610B to transceiver channel 610A. Accordingly, multiplexing circuit 510Y in transceiver channel 610B may be configured to transmit the clock signal at transceiver channel 610B (e.g., delayed_parallel_clock signal 308B) to transceiver channel 610A. It should be appreciated that even though multiplexing circuit 510Y is shown transmitting the clock signal, delayed_parallel_clock signal 308B, from transceiver channel 610B, multiplexing circuit 510Y may be configured such that another clock signal 502B from another transceiver channel may be transmitted as calibration clock signal to transceiver channel 610A instead.

In the embodiment of FIG. 6A, the slave clock signal (e.g., delayed_parallel_clock signal 308A) at transceiver channel 610A may be adjusted or calibrated based on the master clock signal (e.g., delayed_parallel_clock signal 308B) from transceiver channel 610B. Phase detector circuit 305A may compare the phase of the slave clock signal at transceiver channel 610A with the phase of the received master clock signal 308B. As explained above, phase detector circuit 305A may output phase_out signal 302A to calibration logic 320A such that calibration logic 320A may generate a control signal (e.g., clock_slip 322A) to delay or adjust the clock signal (parallel_clock 218A) generated by clock generation buffer circuitry 260A. The clock signal may then be further adjusted by delay circuitry 306A.

Figure 6B:
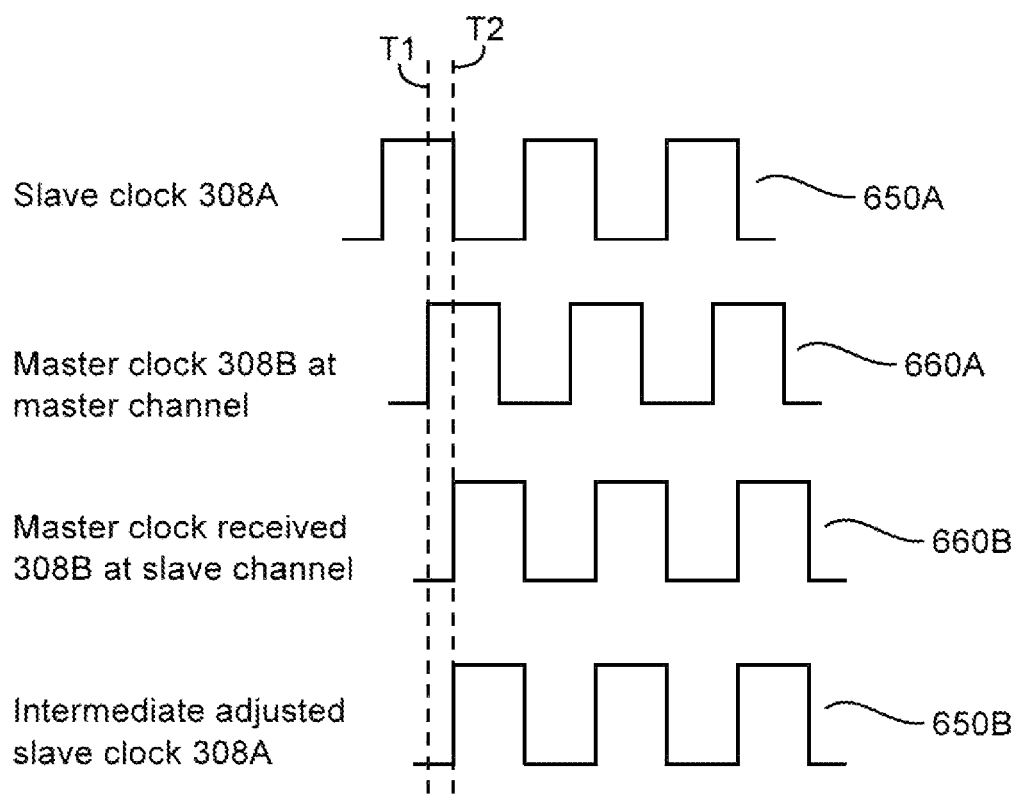
FIG. 6B shows illustrative waveforms that depict the slave and master clock signals of two transceiver channels in the "bonding up" configuration in accordance with one embodiment of the present invention.

FIG. 6B shows illustrative waveforms that depict the slave and master clock signals of two transceiver channels that are coupled together in accordance with one embodiment of the present invention. The waveforms depict when master clock signal 308B arrives at the slave transceiver channel, (e.g., transceiver channel 610A) and how slave clock signal 308A is adjusted according to the received master clock signal 308B. Waveform 650A shows slave clock signal 308A at the slave transceiver channel (e.g., transceiver channel 610A) prior to any adjustment, and waveform 660A shows master clock signal 308B at the master transceiver channel (e.g., transceiver channel 610B).

In the embodiment of FIG. 6A, as master clock signal 308B is routed to slave transceiver channel 610A through multiplexing circuits 510Y and 510A, there may be propagation delay. Waveform 660B shows master clock signal 308B received at the slave transceiver channel (e.g., slave transceiver channel 610A) with propagation delay. As can be seen from waveform 660B, master clock signal 308B received at the slave transceiver channel may be slightly delayed compared to the master clock signal 308B at the master transceiver channel. For instance, as shown in waveform 660A, the first rising edge of master clock signal 308B at the master transceiver channel occurs at time T1 while the first rising edge of master clock signal 308B received at the slave transceiver channel occurs after time T1 (e.g., at time T2). Accordingly, slave clock signal 308A may then be adjusted based on the received master clock signal 308B.

Waveform 650B shows the resulting intermediate adjusted slave clock signal 308A at the slave transceiver channel. Slave clock signal 308A may be adjusted such that its edges are aligned with the edges of the master clock signal 308B that is received at the slave transceiver channel. In the embodiment of FIG. 6B, the first rising edges of the respective master and slave clock signals are aligned at time T2 (as shown by waveforms 660B and 650B). It should be appreciated that such an adjustment may be made in response to the comparison made between the two clock signals (master and slave clock signals, 308B and 308A) by phase detector circuit 305A of FIG. 6A.

Figure 7A:
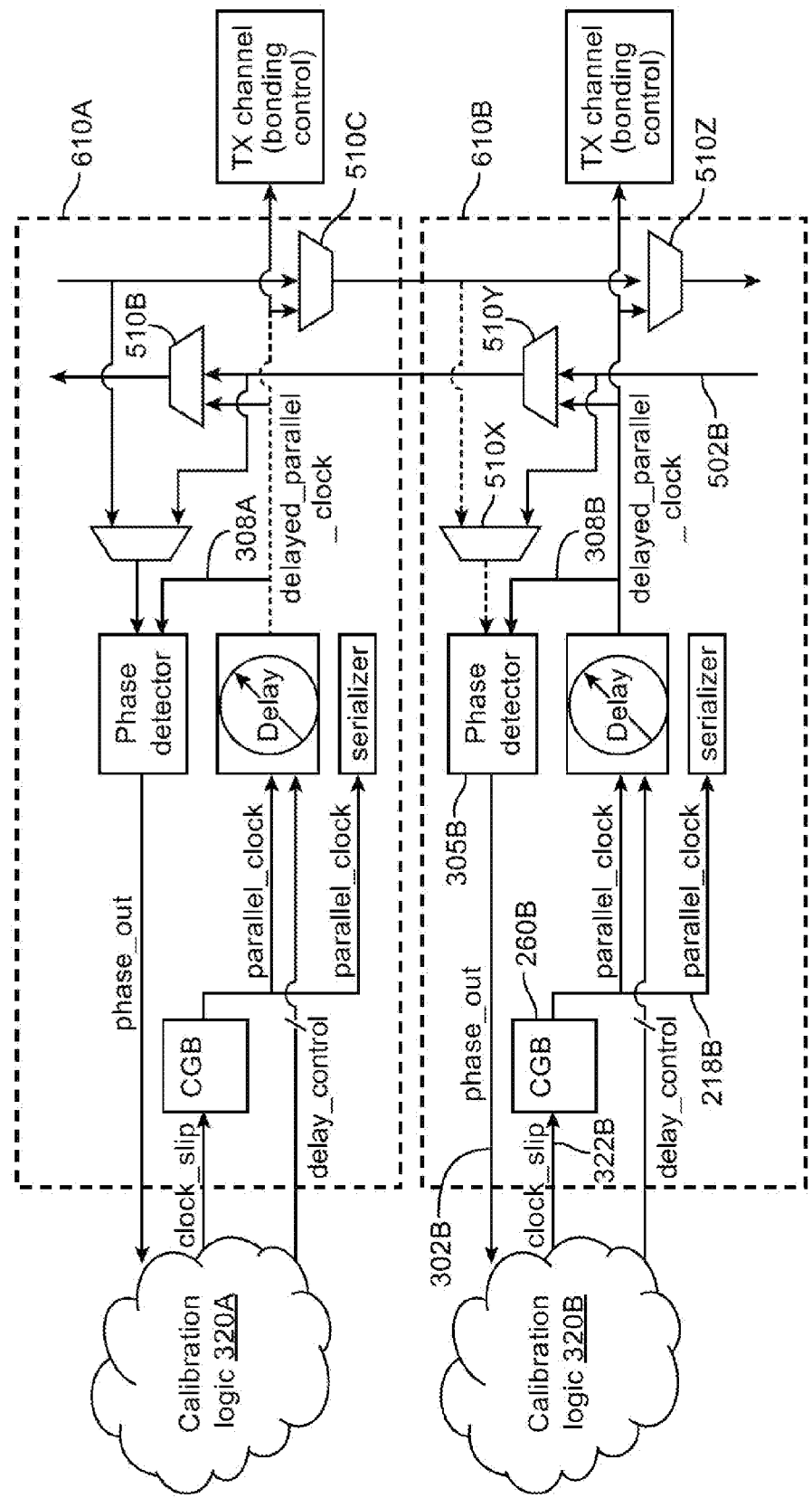
FIG. 7A shows illustrative transceiver channels in a "bonding down" configuration in accordance with one embodiment of the present invention.

In order to fully calibrate the slave clock signal with the master clock signal, the intermediate adjusted slave clock signal 308A (as represented by waveform 650B) may need to be further calibrated so that the clock signals at the slave and master transceiver channels are aligned with each other. FIG. 7A shows illustrative transceiver channels 610A and 610B in a "bonding down" configuration and a resulting adjusted slave clock output with propagation delay compensation in accordance with one embodiment of the present invention. In this example, as before, transceiver channel 610A may be a slave transceiver channel and transceiver channel 610B may be a master transceiver channel. Accordingly, the dotted line in FIG. 7A shows the "bonding down" path of the clock signal transmitted from transceiver channel 610A to transceiver channel 610B.

As shown by the dotted line in FIG. 7A, the slave clock signal (e.g., delayed_parallel_clock signal 308A) is routed from transceiver channel 610A to transceiver channel 610B through multiplexing circuit 510C. Accordingly, multiplexing circuit 510X at transceiver channel 610B may be configured to route the slave clock signal 308A from transceiver channel 610A as an input to phase detector circuit 305B. The master clock signal at transceiver channel 610B may then be adjusted according to the received slave clock signal.

As an example, phase detector circuit 305B may compare the phase of the master clock signal 308B at transceiver channel 610B with the phase of the received slave clock signal 308A. Phase detector circuit 305B may then output phase_out signal 302B to calibration logic 320B so that calibration logic 320B may generate a control signal (e.g., clock_slip 322B) to delay or adjust the master clock signal (e.g., parallel_clock 218B) generated by clock generation buffer circuitry 260B. In one embodiment, the master clock signal is adjusted such that edges of the master clock signal align with edges of the slave clock signal 308A that is received at master transceiver channel 610B. Based on this adjustment, the slave clock signal at slave transceiver channel 610A may further be adjusted so that it is fully aligned with the master clock signal at master transceiver channel 610B (the details of which will be explained by method 800 of FIG. 8). In one embodiment, the slave clock signal at slave transceiver channel 610A may also be adjusted based on a predetermined offset value obtained during characterization of the integrated circuit.

It should be appreciated that even though only two transceiver channels 610A and 610B are shown in the embodiments of FIGS. 6A and 7A, more transceiver channels may be coupled together and calibrated in this context. For instance, multiplexing circuit 510B be configured to route a clock signal from either transceiver channel 610A or 610B to another transceiver channel (not shown) above transceiver channel 610A. Similarly, multiplexing circuit 510Z at transceiver channel 610B may be configured to route a clock signal from either transceiver channel 610A or 610B to yet another transceiver channel (not shown) below transceiver channel 610B.

It should also be appreciated that even though adjacent transceiver channels 610A and 610B are shown in the "bonding up" and "bonding down" configurations in FIGS. 6A and 7A, respectively, non-adjacent transceiver channels may also be coupled together in this context. As an example, multiplexing circuit 570Y may be configured such that a clock signal 502B from another transceiver channel (not shown) is transmitted to transceiver channel 610A instead. As such, depending on how the various multiplexing circuits (e.g., 510A-510C and 510X-510Z) at each transceiver channel are configured, clock signals from one transceiver channel may be routed to any other transceiver channel in the integrated circuit.

Figure 7B:
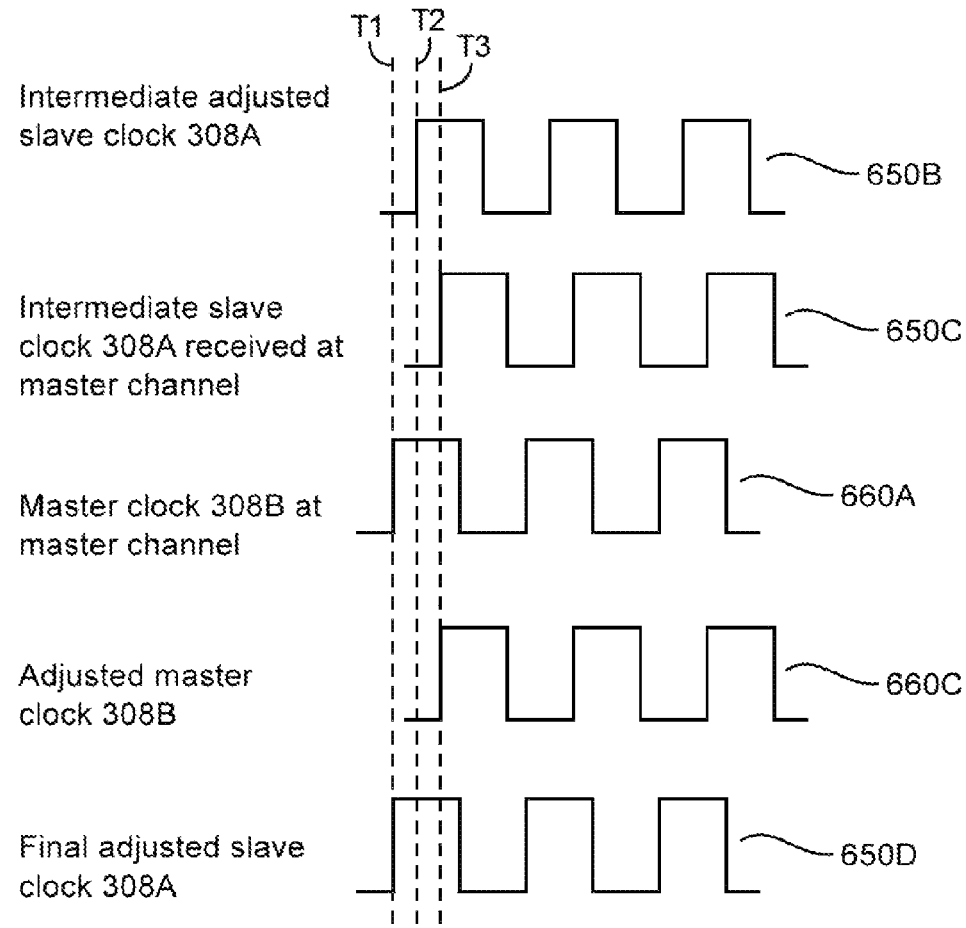
FIG. 7B shows illustrative waveforms that depict the slave and master clock signals of two transceiver channels in the "bonding down" configuration and a resulting adjusted slave clock output with propagation delay compensation applied in accordance with one embodiment of the present invention.

FIG. 7B shows illustrative waveforms that depict the slave and master clock signals of two transceiver channels in a "bonding down" configuration in accordance with one embodiment of the present invention. Waveform 650B shows the intermediate adjusted slave clock signal 308A with a first rising edge at time T2 after the adjustment made with the "bonding up" of transceiver channel 610B (as shown in the embodiment of FIG. 6A). To further calibrate the clock signals at all the bonded transceiver channels (e.g., both transceiver channels 610A and 610B), the intermediate adjusted slave clock signal 308A is routed to the master transceiver channel (as shown in the "bonding down" configuration in FIG. 7A).

Waveform 650C depicts the intermediate adjusted slave clock signal 308A as received by the master transceiver channel (e.g., transceiver channel 610B of FIG. 7A). It should be appreciated that there may be propagation delay as the intermediate adjusted slave clock signal 308A is routed to the master transceiver channel. As such, the first rising edge of the intermediate adjusted slave clock signal 308A, received at the master transceiver channel, occurs at a slightly later time (e.g., time T3) compared to the same clock signal 308A at the slave transceiver channel (as shown by waveform 650B).

Waveform 660A depicts master clock signal 308B at the master transceiver channel prior to any adjustment. As the master transceiver channel receives the intermediate adjusted slave clock signal 308A from the slave transceiver channel, the master clock signal 303B at the master transceiver channel may be adjusted accordingly. Waveform 660C shows the result of the adjusted master clock signal 308B. As can be seen from waveform 660C, the master clock 308B at the master transceiver is adjusted so that its edges are aligned with the edges of the intermediate slave clock signal 308A that is received at the master transceiver channel. As shown in FIG. 7B, the first rising edges of the respective master and slave clock signals are aligned at time T3 (as shown by waveforms 650C and 660C). The total adjustment made to the master clock signal at the master transceiver channel (e.g., shifting the first rising edge of the master clock signal from time T1 to time T3) may then be used to further adjust the slave clock signal 308A at the slave transceiver channel.

In one embodiment, the total adjustment made to the master clock signal at this stage is known as a total propagation delay for a "round-trip" made by the master clock signal 308B by routing the master clock signal 308B to the slave transceiver channel and back to the master transceiver channel. Thus, at this stage, the intermediate adjusted slave clock signal 308A may be shifted back (e.g., shifted to the left) based on half the total adjustment made to the master clock signal 308B (assuming the propagation delays between the master and slave transceiver channels are symmetrical) to fully align the slave clock signal 308A with the master clock signal 308B. In another embodiment, the propagation delays from the master transceiver channel to the slave transceiver channel and back may not be symmetrical. In this scenario, the intermediate adjusted slave clock signal 308A may further be adjusted based on a predetermined offset value (or relevant characterization information stored on the integrated circuit). Waveform 650D depicts the final adjusted slave clock signal 308A at the slave transceiver channel.

As shown in FIG. 7B, after the "bonding up" stage, the first rising edge of the intermediate adjusted slave clock signal 308A may be at time T2 (as shown by waveform 650B). In this example, the total adjustment made to the master clock signal 308B at the master transceiver channel based on the intermediate adjusted slave clock signal 308A that is received at the master transceiver channel is T3−T1 (as shown by waveforms 660A and 660C). Thus, the final adjustment needed to be made to the intermediate adjusted slave clock signal 308A at the slave transceiver channel may be obtained by dividing the tonal adjustment made to the master clock signal 308B by half (e.g., half of the difference between T3 and T1). It should be appreciated that after the total adjustment required is obtained, the master clock signal 308B at the master transceiver channel may be returned to its pre-adjustment state.

In the embodiment of FIG. 7B, the final adjusted slave clock signal 308A at the slave transceiver channel, as shown by waveform 650D, may be fully aligned with the master clock signal 308B at the master transceiver channel (prior to any adjustment, as represented by waveform 660A). The slave and master clock signals at their respective slave and master transceiver channels may thus be fully aligned after the "bonding-up" and "bonding-down" of both transceiver channels (e.g., transceiver channels 610A and 610B as shown in FIGS. 6A and 7A).

Figure 8:
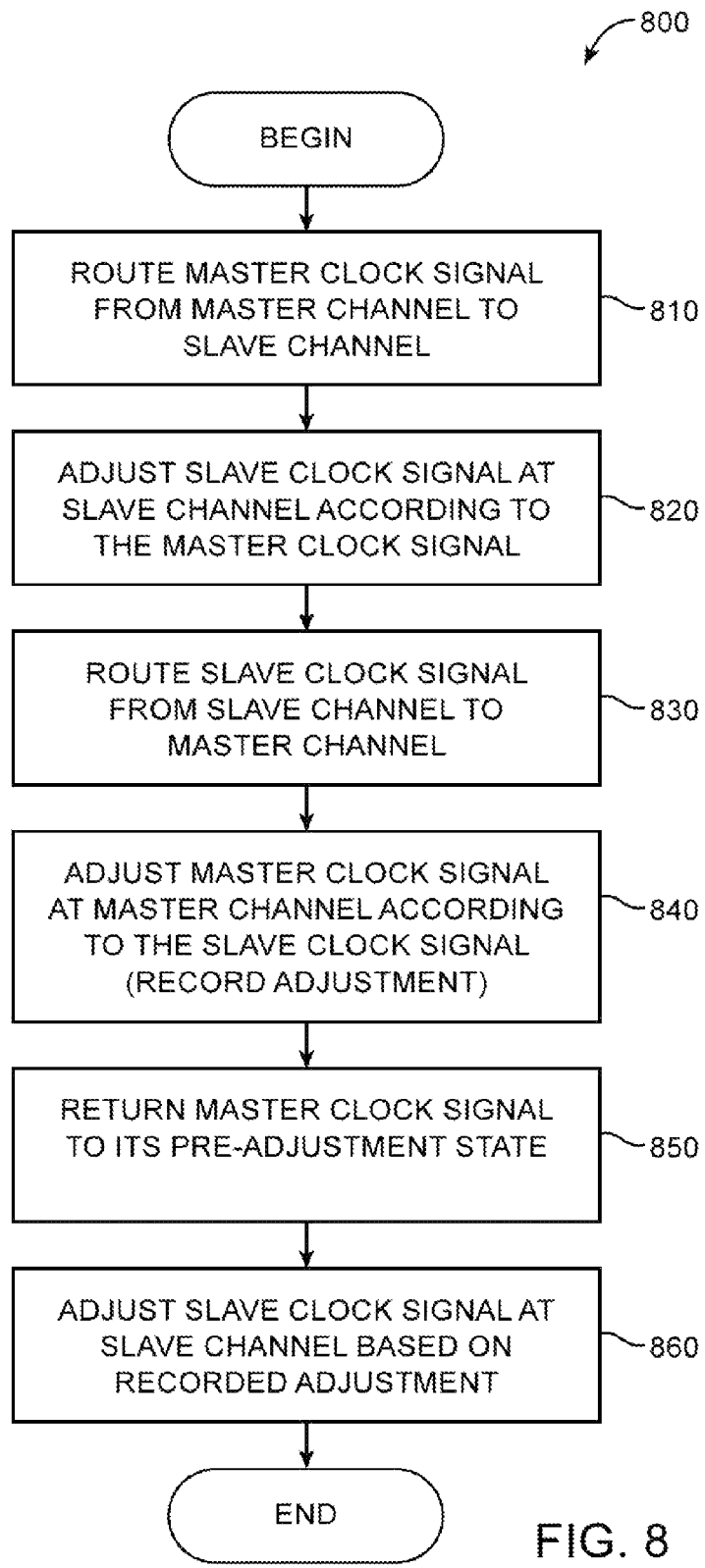
FIG. 8 is a flow chart of illustrative steps for aligning clock signals in an integrated circuit in accordance with one embodiment of the present invention.

FIG. 8 shows illustrative method 800 for aligning clock signals in an integrated circuit in accordance with one embodiment of the present invention. At step 810, a master clock signal is routed from a master channel to a slave channel. At step 820, a slave clock signal at the slave channel may be adjusted according to the master clock signal. In the embodiment of FIG. 6A, the master clock signal from transceiver channel 610B is routed to transceiver channel 610A and the slave clock signal at transceiver channel 610A is then adjusted according to the received master clock signal.

At step 830, the slave clock signal is then routed from the slave channel to the master channel. The master clock signal at the master channel is then adjusted according to the received slave clock signal. The dotted line in the embodiment of FIG. 7A shows the routing of the slave clock signal to the master transceiver channel 610B. As described above, the slave clock signal at this stage may have been adjusted at the slave transceiver channel according to the master clock signal that is routed to the slave transceiver channel. The master clock signal at the master channel at this stage may be adjusted according to the intermediate adjusted slave clock signal that is received at the master transceiver channel (as represented by waveform 650C of FIG. 7B).

The total adjustment made to the master clock signal at this stage may be recorded before the master clock signal is returned to its pre-adjustment state at step 850. In the embodiment of FIG. 7B, waveform 660A shows the master clock signal at its pre-adjustment state. At step 860, the slave clock signal at the slave channel is then adjusted based on the prior adjustment (recorded at step 840) made to the master clock signal at the master transceiver channel. In one embodiment, the slave clock signal is shifted back by half the total adjustment made to the master clock signal such that the slave clock signal at the slave transceiver channel may be aligned with the master clock signal at the master transceiver channel. Waveforms 650A and 650D of FIG. 7B may represent, respectively, the master clock signal at the master transceiver channel, and the final adjusted slave clock signal at the slave transceiver channel.

The embodiments, thus far, were described with respect to programmable logic circuits. The method and apparatus described herein may be incorporated into any suitable circuit. For example, the method and apparatus may also be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of a family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the claims. Accordingly, the present embodiments are to be considered as illustrative and not restrictive, and the invention is not to be limited to the details given herein, but may be modified within the scope and equivalents of the appended claims.

The foregoing is merely illustrative of the principles of this invention and various modifications can be made by those skilled in the art without departing from the scope and spirit of the invention.

What is claimed is:

1. A method of aligning clock signals in a plurality of transceiver channels that includes a master transceiver channel and a slave transceiver channel on an integrated circuit, the method comprising:
   adjusting a phase of a slave clock signal in the slave transceiver channel based on a phase of a master clock signal to produce an intermediate slave clock signal in the slave transceiver channel;
   adjusting the phase of the master clock signal in the master transceiver channel based on a phase of the intermediate slave clock signal to obtain a total adjustment value; and
   adjusting the phase of the intermediate slave clock signal in the slave transceiver channel based on the total adjustment value to obtain an adjusted slave clock signal.

2. The method defined in claim 1 further comprising:
   with delay circuitry, further adjusting the phase of the slave clock signal based on the phase of the master clock signal to produce the intermediate slave clock signal.

3. The method defined in claim 1 further comprising:
   with a first phase detector circuit, comparing the phase of the slave clock signal with the phase of the master clock signal, wherein the intermediate slave clock signal is produced in response to the comparison; and
   with a second phase detector circuit comparing the phase of the intermediate slave clock signal with the phase of the master clock signal, wherein the phase of the master clock signal is adjusted in response to the comparison performed by the second phase detector circuit.

4. The method defined in claim 1 further comprising:
   with delay circuitry, applying a delay to the master clock signal based on the phase of the intermediate slave clock signal, wherein the total adjustment value includes the delay applied to the master clock signal.

5. The method defined in claim 1 further comprising:
   with slave transceiver channel circuitry in the plurality of transceiver channels, receiving the master clock signal prior to adjusting the phase of the slave clock signal; and
   with master transceiver channel circuitry in the plurality of transceiver channels, receiving the intermediate slave clock signal prior to adjusting the phase of the master clock signal.

6. The method defined in claim 5, wherein the slave clock signal is associated with the slave transceiver channel and wherein the master clock signal is associated with the master transceiver channel, wherein receiving the master clock signal with the slave transceiver channel comprises:
   with multiplexing circuitry, selectively routing the master clock signal from the master transceiver channel to the slave transceiver channel.

7. The method defined in claim 6 further comprising:
   with an additional transceiver channel in the plurality of transceiver channels, receiving the adjusted slave clock signal from the slave transceiver channel;
   with a phase detector circuit in the additional transceiver channel, comparing an additional clock signal at the additional transceiver channel with the adjusted slave clock signal received at the additional transceiver channel; and
   in response to the comparison, adjusting a phase of the additional clock signal.

8. The method defined in claim 6, wherein receiving the intermediate slave clock signal comprises:
   with additional multiplexing circuitry, selectively routing the intermediate slave clock signal from the slave transceiver channel to the master transceiver channel.

9. The method defined in claim 1 further comprising:
   readjusting the phase of the master clock signal to a prior phase after the total adjustment value is obtained, wherein the adjusted slave clock signal exhibits a phase that matches the prior phase of the master clock signal.

10. A method of calibrating clock signals in an integrated circuit, comprising:
    with first transceiver channel circuitry clocked with a first clock signal, receiving a second clock signal that is different than the first clock signal from second transceiver channel circuitry;
    with clock generation circuitry in the first transceiver channel circuitry, adjusting a phase of the first clock signal based on a phase of the second clock signal received at the first transceiver channel circuitry; and
    with delay circuitry in the first transceiver channel circuitry, further adjusting the phase of the first clock signal by an amount that is equal an offset value to align the phase of the first clock signal with the phase of the second clock signal at the second transceiver channel circuitry, wherein the offset value is determined during characterization of the integrated circuit.

11. The method defined in claim 10, wherein the first transceiver channel circuitry is a slave transceiver channel and wherein the second transceiver channel circuitry is a master transceiver channel, the method further comprising:
    storing the predetermined offset value in the integrated circuit prior to receiving the second clock signal from the second transceiver channel circuitry.

12. The method defined in claim 10, wherein the second transceiver channel circuitry is adjacent to the first transceiver channel circuitry, the method further comprising:
    with third transceiver channel circuitry having a third clock signal, receiving the first clock signal from the first transceiver channel circuitry, wherein the third transceiver channel circuitry is adjacent to the first transceiver channel circuitry; and
    with an additional clock generation circuitry in the third transceiver channel circuitry, adjusting a phase of the third clock signal based on the phase of the first clock signal received at the third transceiver channel circuitry.

13. The method defined in claim 12 further comprising:
    with delay circuitry in the third transceiver channel circuitry, further adjusting the phase of the third clock signal based on a predetermined offset value to align the phase of the third clock signal with the phase of the first clock signal at the first transceiver channel circuitry.

14. An integrated circuit, comprising:
    transceiver channel circuitry with clock circuitry that outputs a channel clock signal, wherein the channel clock signal comprises a slave parallel clock signal, and wherein the transceiver channel circuitry comprises a slave transceiver channel;
    a phase detector circuit that compares the channel clock signal with a reference clock signal to produce a phase output signal in response to the comparison between the channel clock signal and the reference clock signal, wherein the reference clock signal is selected from the group consisting of: a first clock signal from first additional transceiver channel circuitry, a second clock signal from second additional transceiver channel circuitry, and a master parallel clock signal generated from a master transceiver channel;
    delay circuitry that receives the channel clock signal and the phase output signal and produces a delayed channel clock signal at an output terminal based on the channel clock signal and the control signal; and
    additional clock circuitry at the master transceiver channel that outputs the master parallel clock signal, wherein each of the clock circuitry at the slave transceiver channel and the additional clock circuitry at the master transceiver receives a phase-locked loop clock signal, wherein the clock circuitry and the additional clock circuitry produce the slave and master parallel clock signals, respectively.

15. The integrated circuit defined in claim 14, wherein the transceiver channel circuitry comprises:
    a multiplexing circuit coupled to the phase detector circuit, wherein the multiplexing circuit produces the reference clock signal.

16. The integrated circuit defined in claim 15, wherein the transceiver channel circuitry further comprises:
    a first additional multiplexing circuit that transmits a first channel output clock signal to the first additional transceiver circuitry, wherein the first channel output clock signal is selected from the group consisting of: the channel clock signal and the second clock signal in the second additional transceiver channel circuitry; and
    a second additional multiplexing circuit that transmits a second channel output clock signal to the second additional transceiver circuitry, wherein the second channel output clock signal is selected from the group consisting of: the delayed channel clock signal and the first clock signal from the first additional transceiver channel circuitry.

17. The integrated circuit defined in claim 16, wherein the transceiver channel circuitry is interposed between the first additional transceiver circuitry and the second additional transceiver circuitry.

18. The integrated circuit defined in claim 14, wherein the delayed channel clock signal is a delayed slave parallel clock signal, and wherein the master transceiver channel comprises:
    an additional phase detector circuit that compares the master parallel clock signal with the delayed slave parallel clock signal and produces an additional phase output signal in response to the comparison between the master parallel clock signal with the delayed slave parallel clock signal; and
    additional delay circuitry that receives the master parallel clock signal and the additional phase output signal and produces a delayed master parallel clock signal at an output terminal based on the delayed slave parallel clock signal and the control signal.

* * * * *